(12) United States Patent
Kim et al.

(10) Patent No.: US 8,288,263 B2
(45) Date of Patent: Oct. 16, 2012

(54) METHOD FOR FABRICATING SEMICONDUCTOR DEVICE

(75) Inventors: Gyu-Hyun Kim, Gyeonggi-do (KR); Kwon Hong, Gyeonggi-do (KR); Cha-Deok Dong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 13 days.

(21) Appl. No.: 12/850,903

(22) Filed: Aug. 5, 2010

(65) Prior Publication Data

US 2011/0269304 A1    Nov. 3, 2011

(30) Foreign Application Priority Data

Apr. 30, 2010   (KR) .................. 10-2010-0040922

(51) Int. Cl.
*H01L 21/28* (2006.01)
(52) U.S. Cl. ................. 438/591; 257/E21.209
(58) Field of Classification Search .................. 438/591; 257/E21.209
See application file for complete search history.

(56) References Cited

U.S. PATENT DOCUMENTS

| | | | | |
|---|---|---|---|---|
| 7,166,538 B2 * | 1/2007 | Doshita | ............ | 438/723 |
| 7,767,565 B2 * | 8/2010 | Chung | ............ | 438/585 |
| 2009/0001516 A1 * | 1/2009 | Kim | ............ | 257/534 |
| 2009/0004855 A1 * | 1/2009 | Lee et al. | ............ | 438/669 |
| 2009/0108402 A1 * | 4/2009 | Bae et al. | ............ | 257/532 |
| 2009/0163010 A1 * | 6/2009 | Oh et al. | ............ | 438/587 |
| 2010/0159700 A1 * | 6/2010 | Eun | ............ | 438/694 |
| 2010/0167496 A1 * | 7/2010 | Koo et al. | ............ | 438/437 |
| 2010/0193901 A1 * | 8/2010 | Jang et al. | ............ | 257/520 |
| 2010/0327410 A1 * | 12/2010 | Park et al. | ............ | 257/534 |
| 2011/0101499 A1 * | 5/2011 | Kim et al. | ............ | 257/532 |

FOREIGN PATENT DOCUMENTS

| | | |
|---|---|---|
| KR | 1020050002358 | 1/2005 |
| KR | 1020050019500 | 3/2005 |
| KR | 1020070073053 | 7/2007 |
| KR | 1020090044557 | 5/2009 |

OTHER PUBLICATIONS

Notice of Preliminary Rejection issued from Korean Intellectual Property Office on Jul. 28, 2011.
Notice of Allowance issued by Korean Intellectual Property Office on Nov. 30, 2011.

* cited by examiner

*Primary Examiner* — Alexander Ghyka
*Assistant Examiner* — Stanetta Isaac
(74) *Attorney, Agent, or Firm* — IP & T Group LLP

(57) ABSTRACT

A method for fabricating a semiconductor device includes forming a multilayer, forming a plurality of patterns by etching the multilayer and a portion of the substrate, forming a supporter to support the plurality of patterns, and removing residues formed during the etching.

22 Claims, 19 Drawing Sheets

METHOD FOR FABRICATING SEMICONDUCTOR DEVICE

CROSS-REFERENCE TO RELATED APPLICATIONS

The present application claims priority of Korean Patent Application No. 10-2010-0040922, filed on Apr. 30, 2010, which is incorporated herein by reference in its entirety.

BACKGROUND OF THE INVENTION

Exemplary embodiments of the present invention relate to a method for fabricating a semiconductor device, and more particularly, to a method for fabricating a semiconductor device, which is capable of substantially preventing a high aspect ratio pattern from leaning.

A high aspect ratio pattern is required in a process for fabricating a semiconductor device such as DRAM or a NAND flash device. The high aspect ratio pattern may include a trench for element isolation, a gate, a storage node and so on. In a vertical cell with $4F^2$ structure, a high aspect ratio trench may be provided to form a buried bit line.

In such a high aspect ratio pattern, a ratio of depth D to line width L is defined as an aspect ratio (D/L).

During an etching process for forming a pattern, etching residues are formed on the sidewalls of the pattern and the bottom. The etching residues are removed by a subsequent cleaning process. The etching residues are referred to as post etch residues (PER).

However, due to the increase of the aspect ratio, pattern leaning frequently occurs after the cleaning process, even though pattern leaning may not occur before the cleaning process.

FIG. 1 is a photograph showing a case in which pattern leaning occurs after the subsequent cleaning process. Referring to FIG. 1, it can be seen that a bridge occurs between adjacent patterns due to the pattern leaning.

Furthermore, as semiconductor devices shrink, the aspect ratio rapidly increases. Therefore, when the design rule is equal to or less than 20 nm, it is difficult to prevent pattern leaning during a cleaning process for a pattern having an aspect ratio of 15 or more.

SUMMARY OF THE INVENTION

An embodiment of the present invention is directed to a method for fabricating a semiconductor device, which is capable of substantially preventing a high aspect ratio pattern from leaning.

In accordance with an embodiment of the present invention, a method for fabricating a semiconductor device includes: forming a multilayer over a substrate; forming a plurality of patterns by etching the multilayer and a portion of the substrate; forming a supporter to support the plurality of patterns; and removing residues formed during the etching. The forming of the supporter may include: forming an insulation layer which gap-fills the space between the patterns and covers the top surfaces of the patterns; forming a photoresist pattern over the insulation layer such that the photoresist pattern crosses the patterns; and etching the insulation layer by using the photoresist pattern as an etching barrier. The insulation layer may include oxide. The forming of the supporter may include: forming a first insulation layer to gap-fill the space between the patterns; recessing the first insulation layer to expose the top surfaces of the patterns; stacking a second layer and a third layer over the recessed first insulation layer; forming a photoresist pattern over the third insulation layer such that the photoresist pattern crosses the patterns; etching the third insulation layer by using the photoresist pattern as an etching barrier; removing the photoresist pattern; and forming the supporter by partially etching the second insulation using the third insulation layer as an etching barrier. The first and third insulation layers may be formed of oxide, and the is second insulation layer may be formed of nitride.

In accordance with another embodiment of the present invention, a method for fabricating a semiconductor device includes: a forming a plurality of pattern by etching a structure; forming a supporter which crosses the patterns and supports the patterns; and removing etching residues formed when the patterns are formed.

DESCRIPTION OF SPECIFIC EMBODIMENTS

Figure 1:
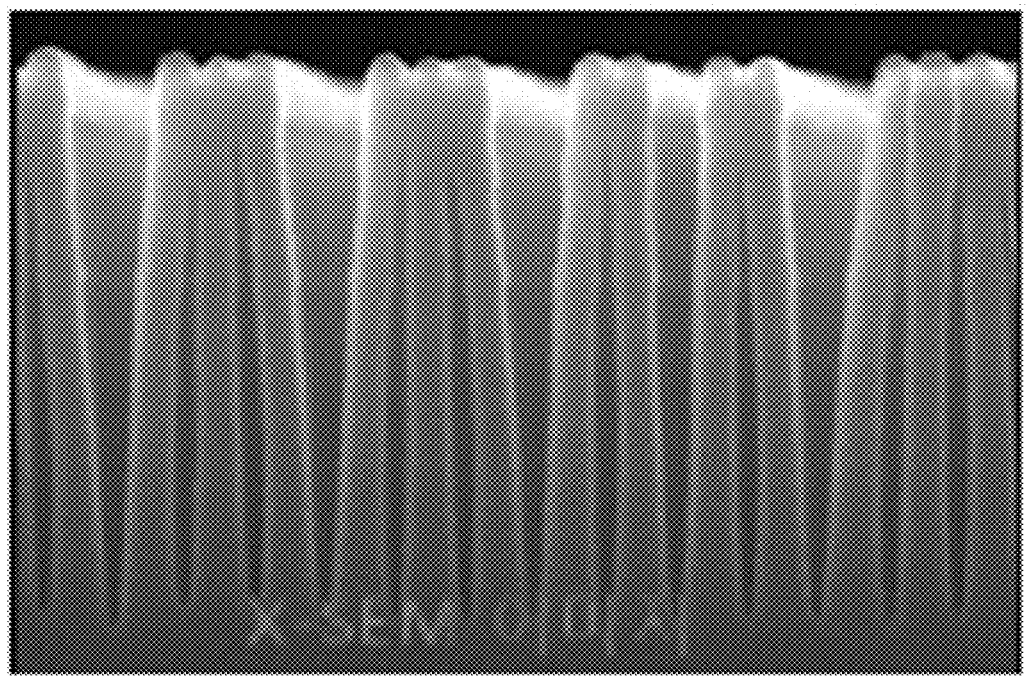
FIG. 1 is a photograph showing a case in which pattern leaning occurs after a cleaning process.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers is to a case where the first layer is formed directly on the second layer or the substrate but also a case where a third layer exists between the first layer and the second layer or the substrate.

In exemplary embodiments of the present invention, a supporter is applied to substantially prevent high aspect ratio patterns from leaning. The supporter includes an insulation layer. The supporter may include oxide in a first embodiment of the present invention or nitride in a second embodiment of the present invention. After the supporter is applied, a subsequent cleaning process is performed. Therefore, the pattern leaning may be substantially prevented/reduced. The supporter is formed in a direction perpendicular to the patterns.

The number of supporters may be differently applied under a condition in which structural stability is secured. Furthermore, since the supporter is not removed during the subsequent cleaning process, the existence of the supporter may be checked by Transmission Electron Microscope (TEM)/Scanning Electron Microscope (SEM) analysis.

Figure 2A:
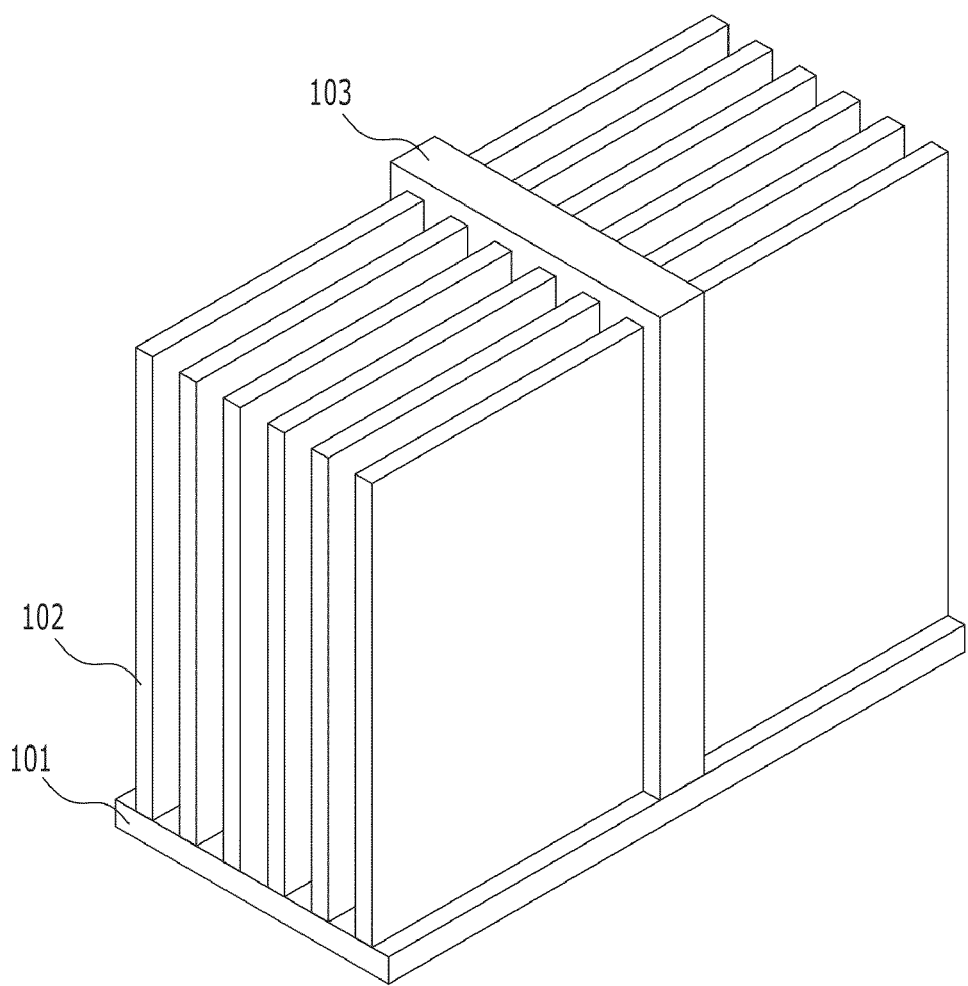
FIG. 2A is a diagram illustrating a semiconductor device in accordance with a first embodiment of the present invention.

FIG. 2A is a diagram illustrating a semiconductor device in accordance with a first embodiment of the present invention.

Referring to FIG. 2A, a plurality of patterns 102 are formed on a substrate 101. A supporter 103 which simultaneously supports the plurality of patterns 102 is formed. The supporter 103 partially covers the space between the respective patterns 102 and the upper surfaces of the patterns 102.

The substrate 101 according to an example includes a silicon substrate.

The adjacent patterns 102 have the same distance from each other. The respective patterns 102 have the same height. Accordingly, the patterns 102 have the same aspect ratio. The patterns 102 may have an aspect ratio of at least 10 or more, even though the aspect ratio may differ depending on the design rule. The patterns 102 may include active regions, gates, metallic interconnection, bit lines, storage nodes and so on. When the patterns 102 include active regions, the space between the respective patterns 102 becomes a trench which is a region to be gap-filled with an element isolation layer. When the patterns 102 include gates, metallic interconnections, and bit lines, an insulation layer such as an interlayer dielectric layer is formed between the patterns 102. When the patterns 102 include storage nodes, a dielectric layer and a top electrode are formed between the patterns 102. In this case, the storage nodes may include a cylinder type storage node and a pillar type storage node. As such, the patterns 102 are structures which are formed in a process for fabricating a semiconductor memory device such as DRAM or a NAND flash memory device. The patterns 102 may have a line shape, an island shape, a cylinder shape, or a pillar shape.

The patterns 102 in accordance with the first embodiment of the present invention are formed by a self aligned shallow trench isolation (SA-STI) process for a NAND flash memory device. Accordingly, the patterns 102 may include patterns which are formed by sequentially stacking a tunnel insulation layer, a floating gate, and a hard mask layer on a substrate and then etched. The patterns 102 may have a line shape extending in any one direction, and a trench in which an element isolation layer is to be buried is formed between the patterns 102.

The supporter 103 is formed to simultaneously support the plurality of patterns 102. The supporter 103 may have a line shape, when seen from the plan view. The supporter 103 may extend in a direction perpendicular to the patterns 102. The supporter 103 partially covers the space between the respective patterns 102 and the top surfaces of the patterns 102, while crossing the patterns 102 at right angles. The supporter 103 includes an insulation layer. The supporter 103 according to an example includes oxide. Accordingly, the supporter 103 may be an oxide supporter.

Figure 2B:
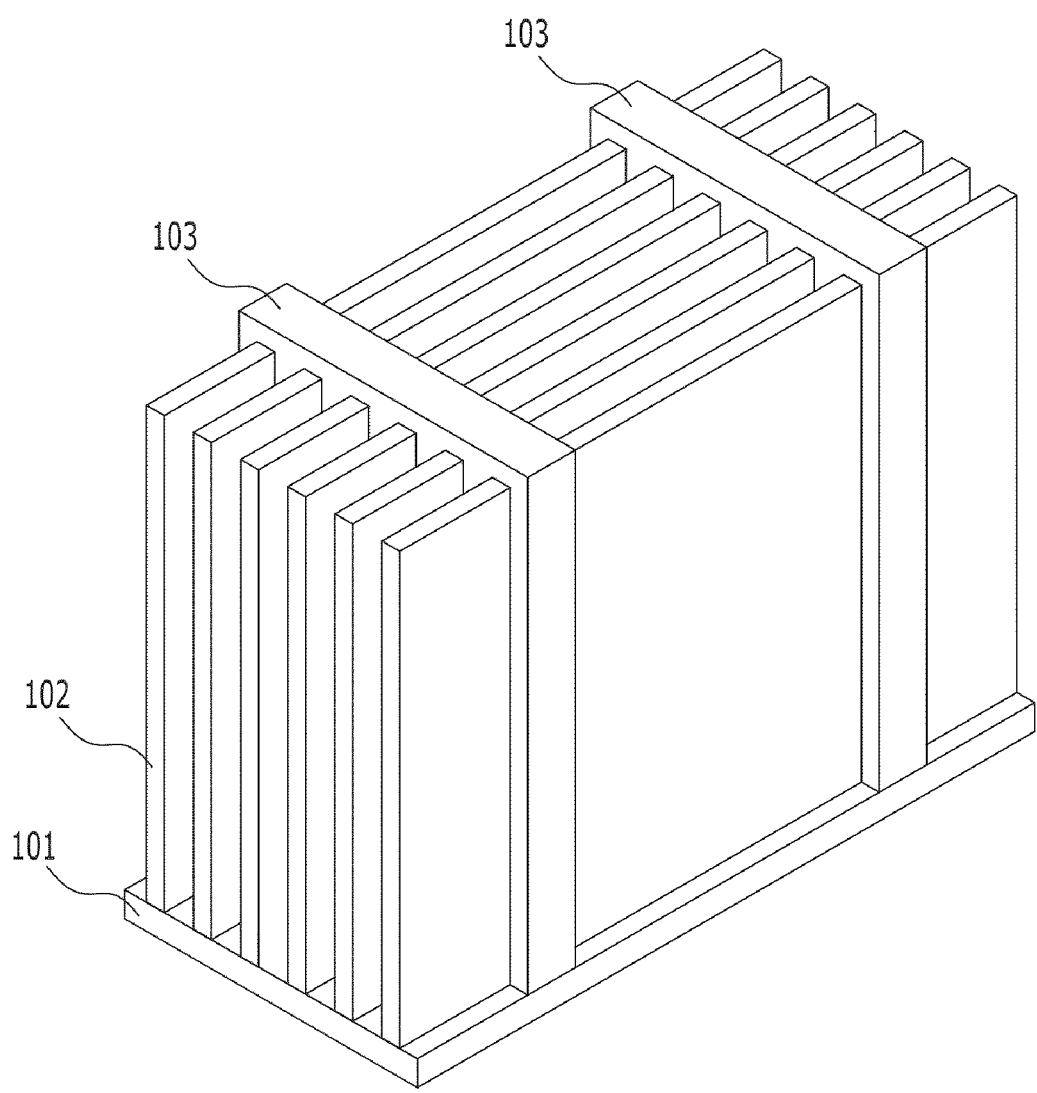
FIG. 2B is a diagram illustrating a semiconductor device in accordance with a modification of the first embodiment of the present invention.

FIG. 2B is a diagram illustrating a semiconductor device in accordance with a modification of the first embodiment of the present invention. The semiconductor device includes two supporters 103.

FIGS. 3A to 3F are plan views illustrating a method for fabricating the semiconductor device in accordance with the first embodiment of the present invention. FIGS. 4A to 4F are cross-sectional views illustrating the method for fabricating the semiconductor device in accordance with the first embodiment of the present invention. FIGS. 4A to 4F include cross-sectional views of the semiconductor device along lines A-A' and B-B' in FIGS. 3A to 3F, respectively.

Figure 3A:
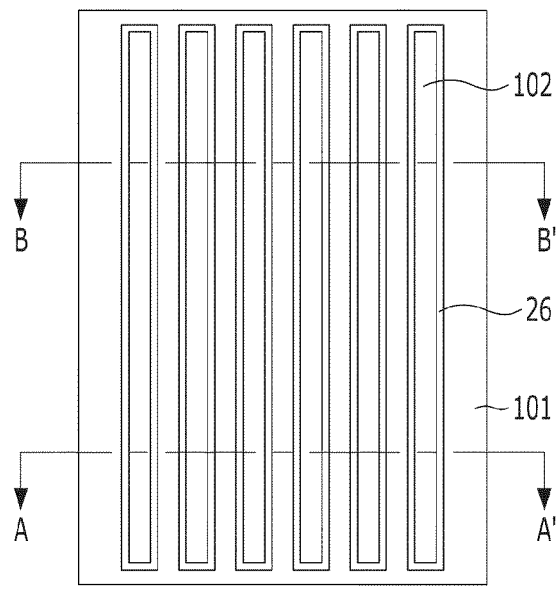
FIGS. 3A to 3F are plan views illustrating a method for fabricating the semiconductor device in accordance with the first embodiment of the present invention.
Figure 4A:
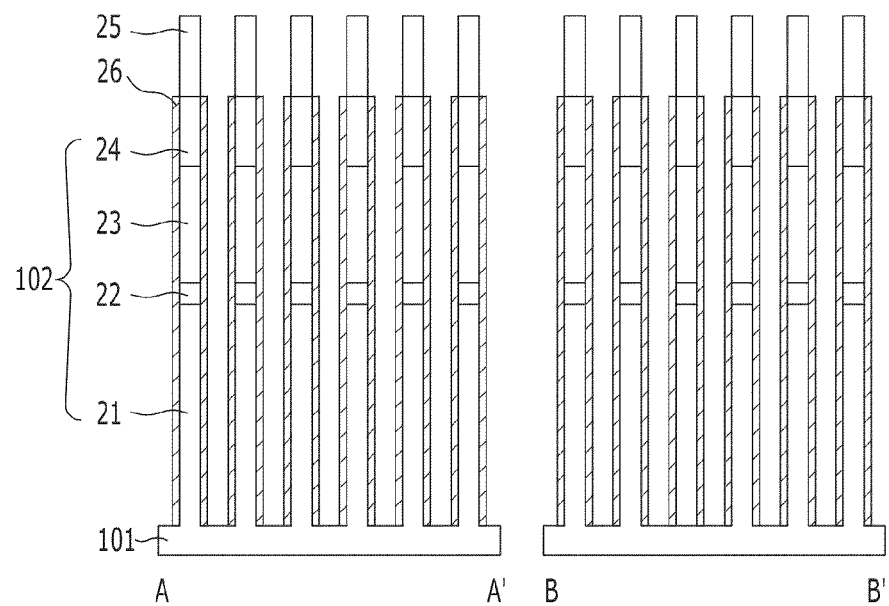
FIGS. 4A to 4F are cross-sectional views illustrating the method for fabricating the semiconductor device in accordance with the first embodiment of the present invention.

Referring to FIGS. 3A and 4A, a plurality of patterns 102 are formed. The patterns 102 may include an active region, a gate, a metal interconnection, a bit line, and a storage node of a capacitor. In the first embodiment of the present invention, each of the patterns 102 has a structure in which an active region 21, a tunnel insulation layer 22, a floating gate 23, and a hard mask layer 24 (shown in FIG. 4A) are sequentially stacked. Such a multilayer structure includes a structure which is applied to a flash memory device. In particular, a process for forming the patterns 102 according to an example includes an SA-STI process for a flash memory device. Accordingly, the space between the patterns 102 becomes a trench in which an element isolation layer is to be buried in a subsequent process. The hard mask layer 24 may be formed of only a nitride layer or may include a multilayer in which a nitride layer and an oxide layer are stacked. The tunnel insulation layer 22 according to an example includes oxide. According to an example, the floating gate 23 includes polysilicon, and the hard mask layer 24 is used as a stop layer during a planarization process and an etching barrier during an etching process.

The patterns 102 are formed by the following process.

First, a structure in which a tunnel insulation layer 22, a conductive layer for a floating gate 23, and a hard mask layer 24 are sequentially stacked is formed on a substrate 101.

A first photoresist pattern 25 is formed on the hard mask layer 24. The first photoresist pattern 25 includes a mask for the element isolation process.

Using the first photoresist pattern 25 as an etching barrier, the hard mask layer 24 is etched. Then, using the hard mask layer 24 as an etching barrier, the conductive layer for the floating gate 23 and the tunnel insulation layer 22 are etched. The substrate 101 is etched to a desired depth to form an active region 21. Accordingly, a plurality of patterns 102 are formed. The patterns 102 have the same aspect ratio. When the design rule of 20 nm is applied, the patterns 102 may have an aspect ratio of at least 10 or more, even though the aspect ratio may differ depending on the design rule.

For the etching process for forming the patterns 102, dry etching is applied. Accordingly, etching residues 26 may occur on the sidewalls of the patterns 102 and the bottom between the patterns 102. To remove the etching residues 26, a cleaning process is subsequently performed, where pattern leaning may occur.

In the first embodiment of the present invention, a supporter process is performed as follows to substantially prevent the pattern leaning, before the cleaning process is performed.

Figure 3B:
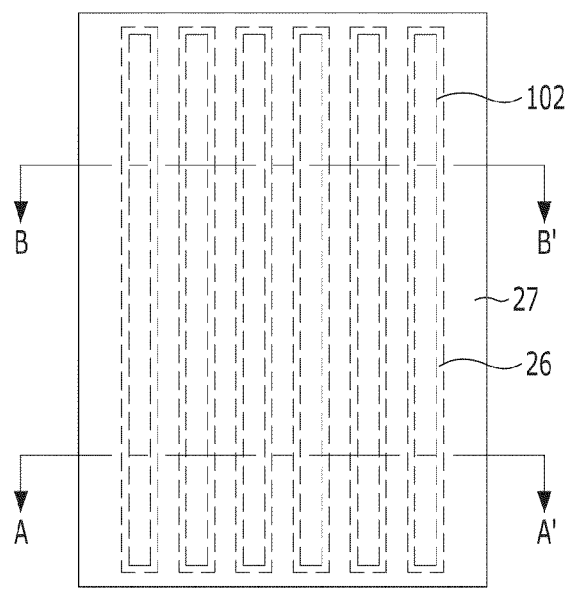
Figure 4B:
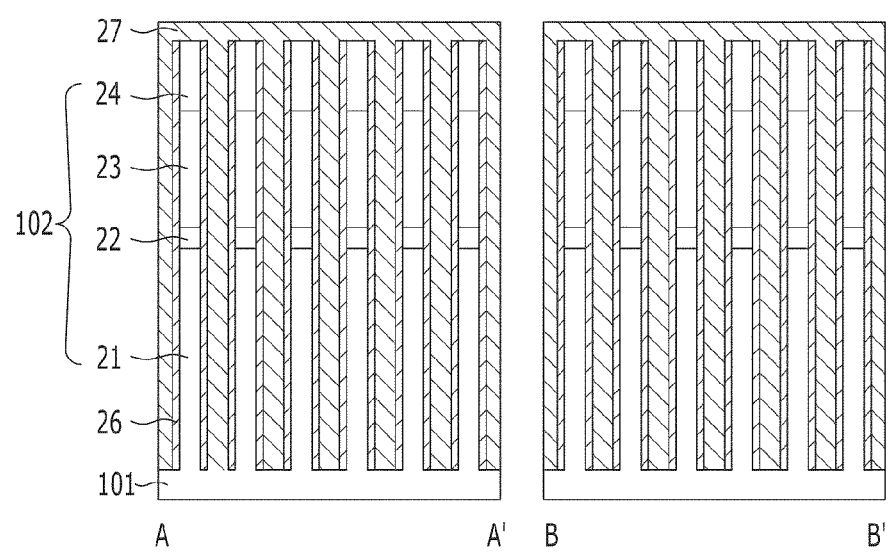

Referring to FIGS. 3B and 4B, the first photoresist pattern 25 is removed. In removing the first photoresist pattern 25, the etching residues 26 may still remain.

An insulation layer 27 is then formed on the entire surface of the resultant structure including the patterns 102. The insulation layer 27 is formed to gap fill the space between the patterns 102. The insulation layer 27 according to an example includes oxide. The insulation layer 27 may include any one selected from the group consisting of ultra low temperature oxide (ULTO), high temperature oxide (HTO), low pressure tetra ethyl ortho silicate (LPTEOS), plasma enhanced tetra ethyl ortho silicate (PETEOS), O₃-TEOS, and undoped silicate glass (USG). Since the distance between the patterns 102 is small, the space between the patterns 102 may be completely gap-filled with the insulation layer 27 even though the insulation layer may not be thick.

Figure 3C:
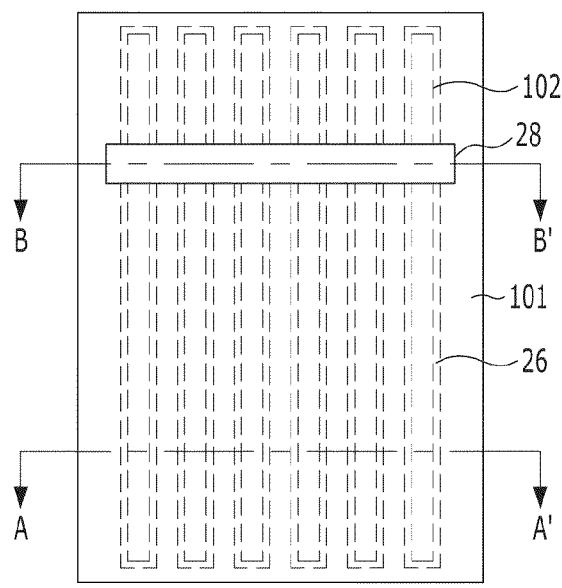
Figure 4C:
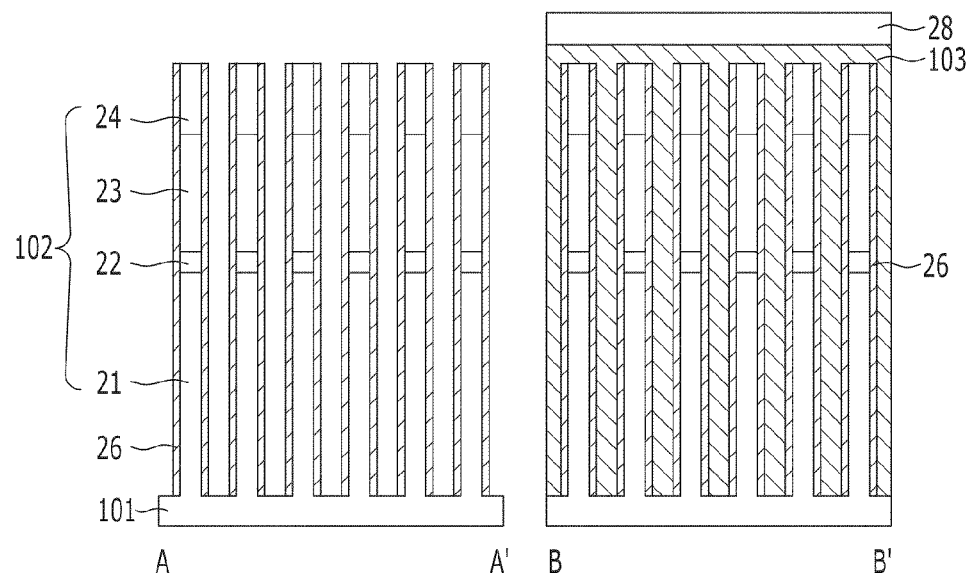

Referring to FIGS. 3C and 4C, a second photoresist pattern 28 is formed on the insulation layer 27. The second photoresist pattern 28 is a mask for forming the supporter. The second photoresist pattern 28 may be formed in a line type extending in a direction perpendicular to the first photoresist pattern of FIG. 3A. The number of second photoresist patterns 28 is determined depending on the number of supporters. In the first embodiment of the present invention, it is assumed that one supporter is formed. Accordingly, one second photoresist pattern 28 is formed in a line type. The distance between the supporters and the positions of the supporters may be set at a desired ratio with respect to the entire length of the patterns, and may differ depending on pattern density.

The insulation layer 27 is etched by using the second photoresist pattern 28 as an etching barrier. Accordingly, the supporter 103 is formed. The supporter 103 simultaneously supports the plurality of patterns 102. According to the plan view, the supporter 103 may have a line shape. Specifically, the supporter 103 is formed in a line shape extending in a direction perpendicular to the patterns 102. The supporter 103 partially covers the space between the patterns 102 and covers the top surfaces of the patterns 102, while crossing the patterns 102 at right angles. Since the insulation layer 27 according to an example is an oxide layer, the supporter 103 is an oxide supporter.

Figure 3D:
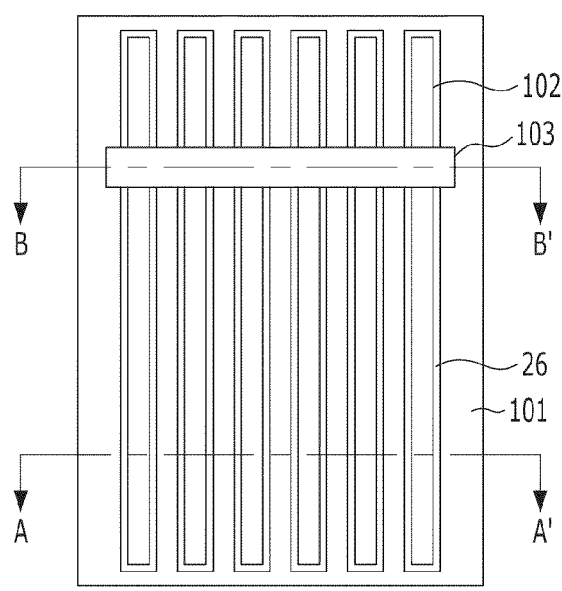
Figure 4D:
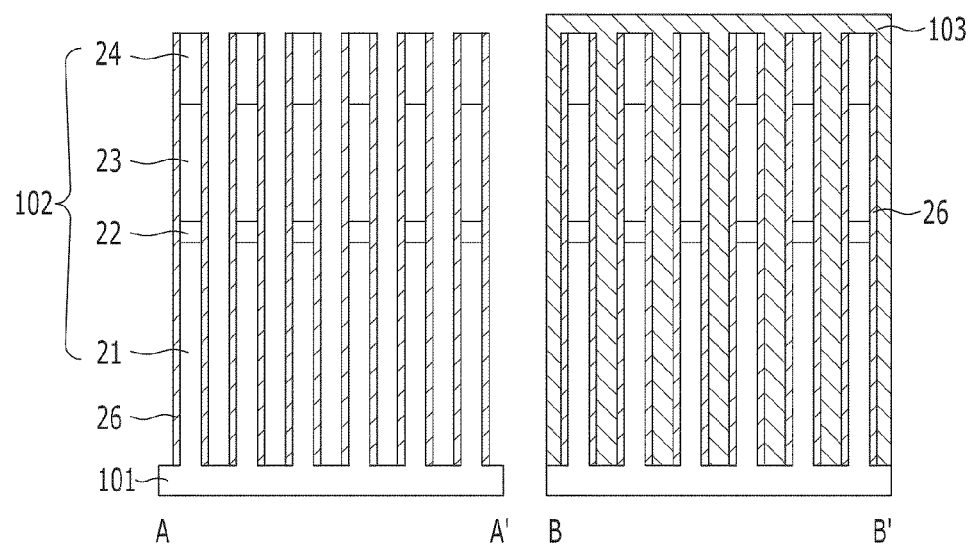

Referring to FIGS. 3D and 4D, the second photoresist pattern 28 is removed through, for example, a strip process. In removing the second resist pattern 28, the etching residues 26 may still remain.

Figure 3E:
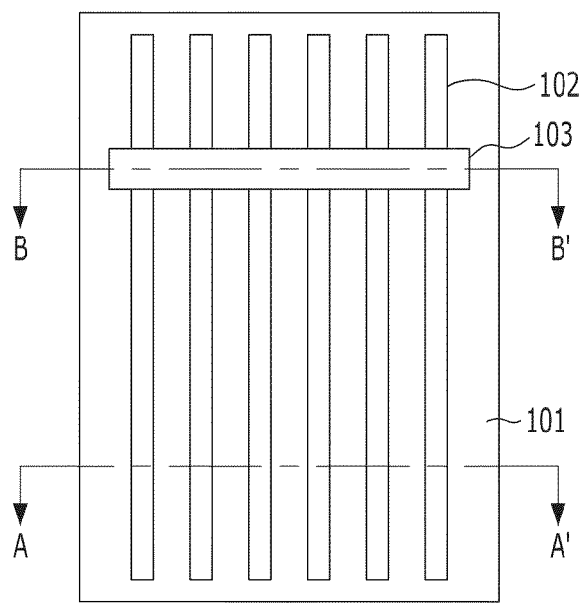
Figure 4E:
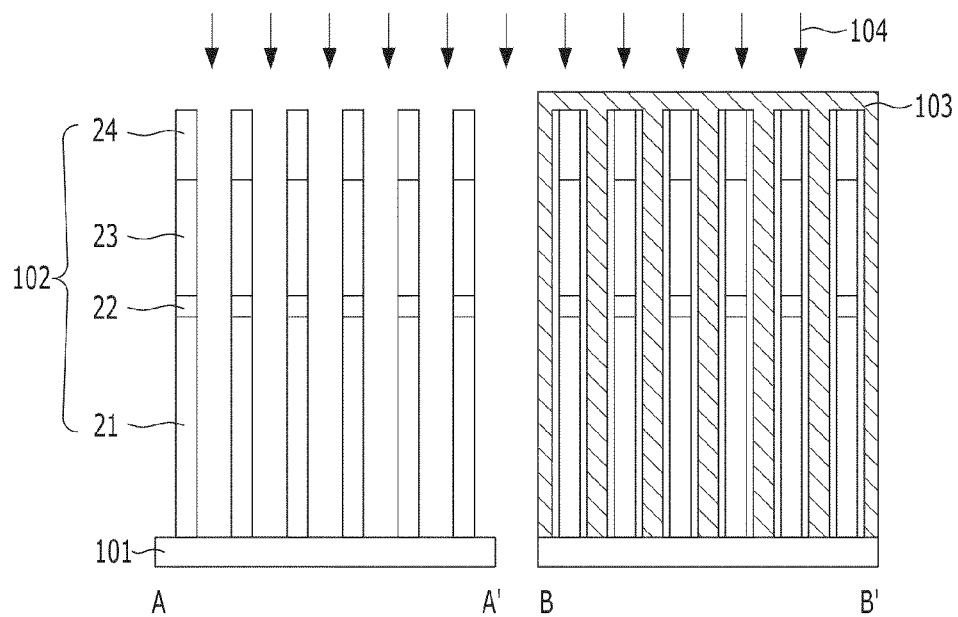

Referring to FIGS. 3E and 4E, a cleaning process 104 for removing the etching residues 26 is performed. After the cleaning process 104, a drying process may be further performed. Since the supporter 103 reliably supports the patterns 102, the pattern leaning is substantially prevented during the cleaning process 104. Furthermore, even during the strip process for removing the second photoresist pattern 28, the pattern leaning is substantially prevented by the supporter 103.

Figure 3F:
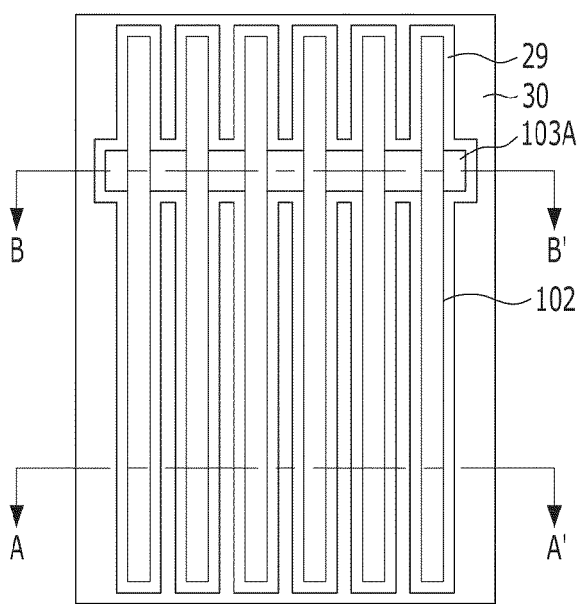
Figure 4F:
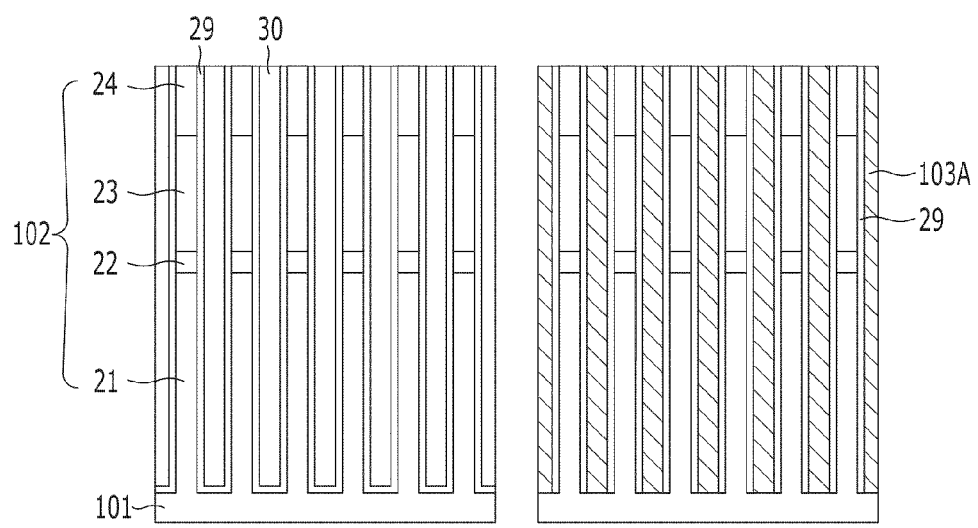

Referring to FIGS. 3F and 4F, an element isolation layer 30 is formed to gap fill the space between the respective patterns 102. The element isolation layer 30 includes oxide such as silicon oxide. The element isolation layer 30 may include a spin-on insulation layer based on polysilazane. When the element isolation layer 30 is formed, a planarization process using a chemical polishing planarization (CMP) process is performed until the CMP process is stopped at the hard mask layer 24. At this time, a portion of the supporter 103 may be planarized at the same time. After the planarization process, the remaining supporter 103A serves as an element isolation layer. Before the element isolation layer 30 is formed, a pre-cleaning process and a sidewall oxidation process may be performed.

Figure 5A:
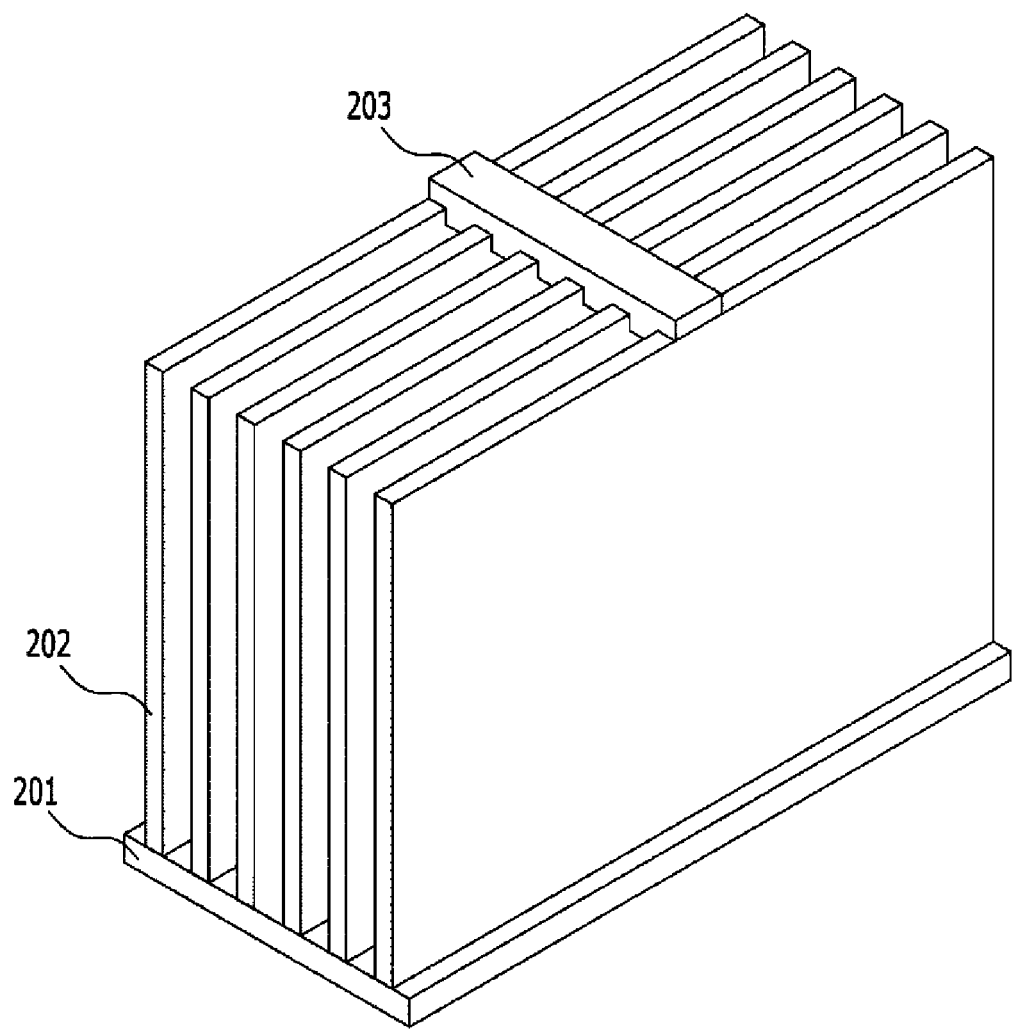
FIG. 5A is a diagram illustrating a semiconductor device in accordance with a second embodiment of the present invention.

FIG. 5A is a diagram illustrating a semiconductor device in accordance with a second embodiment of the present invention.

Referring to FIG. 5A, a plurality of patterns 202 are formed on a substrate 201. A supporter 203 which simultaneously supports the plurality of patterns 202 is formed. The supporter 203 in accordance with the second embodiment of the present invention does not fill the entire space in depth between the respective patterns, different from the supporter 103 in FIG. 2B in accordance with the first embodiment of the present invention.

The substrate 201 includes a silicon substrate.

The adjacent patterns 202 have the same distance from each other. The respective patterns 202 have the same height. Accordingly, the patterns 202 have the same aspect ratio. The patterns 202 may have an aspect ratio of at least 10 or more, even though the aspect ratio may differ depending on the design rule. The patterns 202 may include active regions, gates, metallic interconnection, bit lines, storage nodes and so on. When the patterns 202 include active regions, the space between the respective patterns 202 becomes a trench which is a region to be gap-filled with an element isolation layer. When the patterns 202 include gates, metallic interconnections, and bit lines, an insulation layer such as an interlayer dielectric layer is formed between the patterns 202. When the patterns 202 include storage nodes, a dielectric layer and a top electrode are formed between the patterns 202. In this case, the storage nodes may include a cylinder type storage node and a pillar type storage node. As such, the patterns 102 are structures which are formed in a process for fabricating a semiconductor memory device such as DRAM or a NAND flash memory device. The patterns 202 may have a line shape, an island shape, a cylinder shape, or a pillar shape.

The patterns 202 in accordance with the first embodiment of the present invention are patterns which are formed by the SA-STI process for a NAND flash memory device. Accordingly, the patterns 202 may include patterns which are formed by sequentially stacking a tunnel insulation layer, a floating gate, and a hard mask layer on a substrate and then etched. The patterns 202 may be formed in a line shape extending in any one direction, and a trench in which an element isolation layer is to be buried is formed between the patterns 102.

The supporter 203 simultaneously supports the plurality of patterns 202 together and is formed as a floating type with the space below the support 203 being hollow. The supporter 203 may have a line shape, when seen from the plan view. The supporter 203 may extend in a direction perpendicular to the patterns 202. The supporter 203 partially covers the space between the respective patterns 102 and the top surfaces of the patterns 202, while crossing the patterns 202 at right angles. The supporter 203 includes an insulation layer. The supporter 203 according to an example includes nitride. Accordingly, the supporter 203 is a nitride supporter.

Figure 5B:
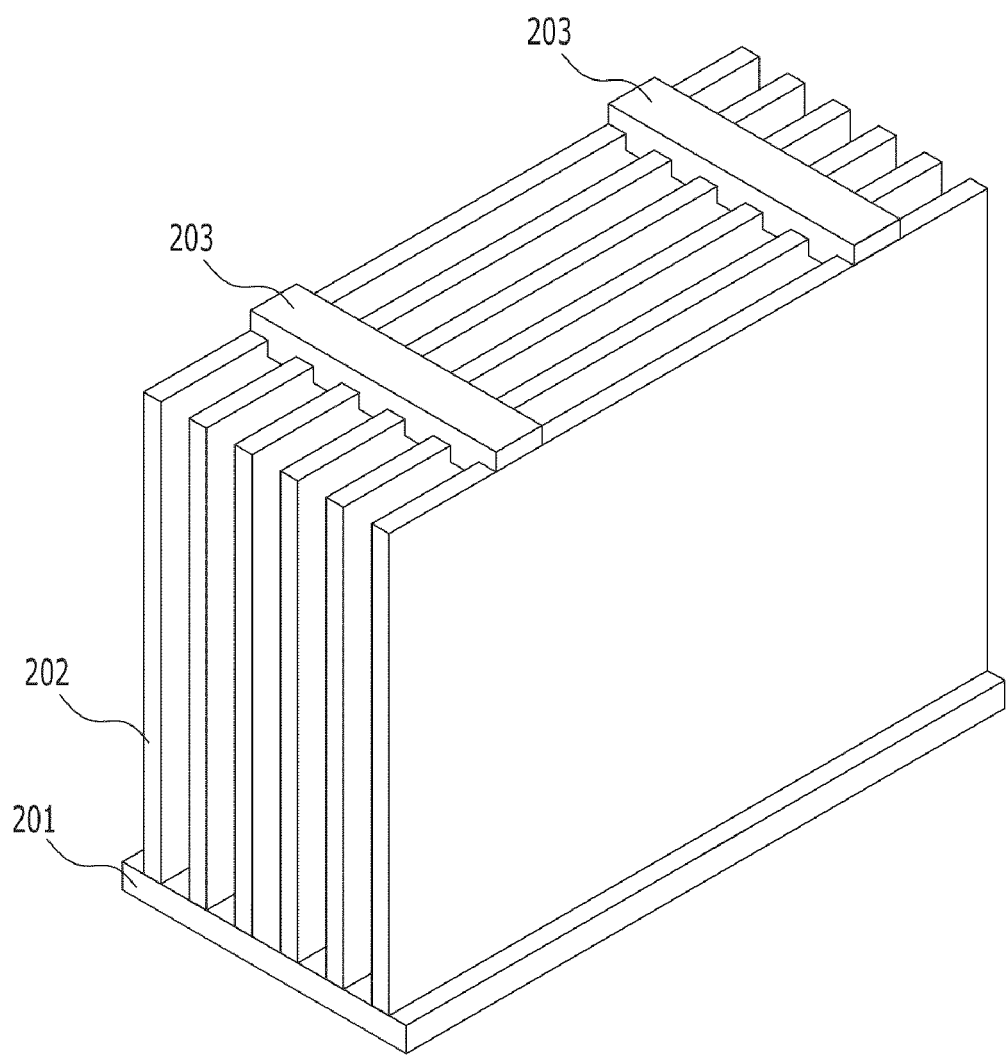
FIG. 5B is a diagram illustrating a semiconductor device in accordance with a modification of the second embodiment of the present invention.

FIG. 5B is a diagram illustrating a semiconductor device in accordance with a modification of the second embodiment of the present invention. The semiconductor device includes two floating supporters 203.

FIGS. 6A to 6H are plan views illustrating a method for fabricating the semiconductor device in accordance with the second embodiment of the present invention. FIGS. 7A to 7F are cross-sectional views illustrating the method for fabricating the semiconductor device in accordance with the second embodiment of the present invention.

Figure 6A:
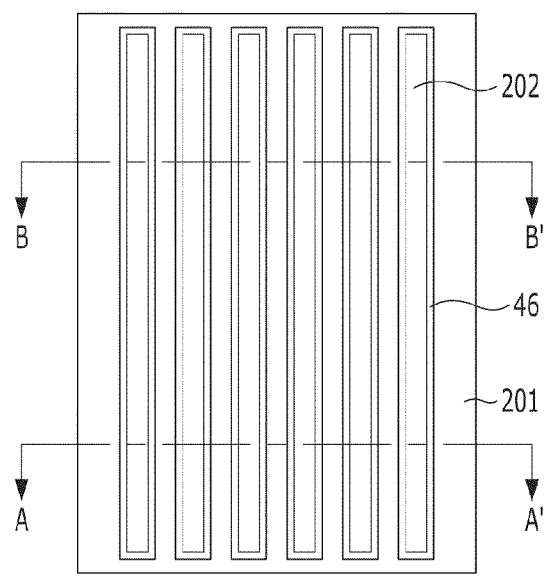
FIGS. 6A to 6H are plan views illustrating a method for fabricating the semiconductor device in accordance with the second embodiment of the present invention.
Figure 7A:
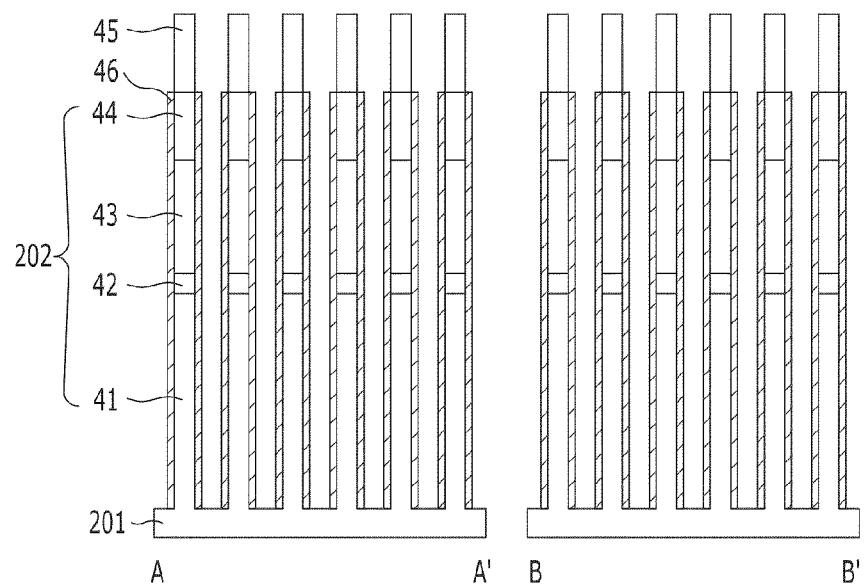
FIGS. 7A to 7H are cross-sectional views illustrating the method for fabricating the semiconductor device in accordance with the second embodiment of the present invention.

Referring to FIGS. 6A and 7A, a plurality of patterns 202 are formed on a substrate 201. The patterns 202 may include an active region, a gate, a metal interconnection, a bit line, and a storage node of a capacitor. In the second embodiment of the present invention, each of the patterns 202 has a structure in which an active region 41, a tunnel insulation layer 42, a floating gate 43, and a hard mask layer 44 (shown in FIG. 7A) are sequentially stacked. Such a multilayer structure includes a structure which is applied to a flash memory device. In particular, a process for forming the patterns 202 includes an SA-STI process for a flash memory device.

Accordingly, the space between the patterns 202 becomes a trench in which an element isolation layer is to be buried in a subsequent process. The hard mask layer 44 may be formed of only a nitride layer or may include a multilayer in which a nitride layer and an oxide layer are stacked. The tunnel insulation layer 42 according to an example includes oxide. According to an example, the floating gate 43 includes polysilicon, and the hard mask layer 44 is used as a stop layer during a planarization process and an etching barrier during an etching process.

The patterns 202 are formed by the following process.

First, a structure in which a tunnel insulation layer 42, a conductive layer for a floating gate 43, and a hard mask layer 44 are sequentially stacked is formed on a substrate 201.

A first photoresist pattern 45 is formed on the hard mask layer 44. The first photoresist pattern 45 includes a mask for the element isolation process.

Using the first photoresist pattern 45 as an etching barrier, the hard mask layer 44 is etched. Then, using the hard mask layer 44 as an etching barrier, the conductive layer for the floating gate 43 and the tunnel insulation layer 42 are etched. The substrate 201 is etched to a desired depth to form an active region 41. Accordingly, a plurality of patterns 202 are formed. The patterns 202 have the same aspect ratio. When the design rule of 20 nm is applied, the patterns 202 may have an aspect ratio of at least 10 or more, even though the aspect ratio may differ depending on the design rule.

For the etching process for forming the patterns 202, dry etching is applied. Accordingly, etching residues 46 may occur on the sidewalls of the patterns 202 and the bottom between the patterns 202. To remove the etching residues 46, a cleaning process is subsequently performed, where pattern leaning may occur.

In the second embodiment of the present invention, a supporter process is performed as follows to substantially prevent the pattern leaning, before the cleaning process is performed.

Figure 6B:
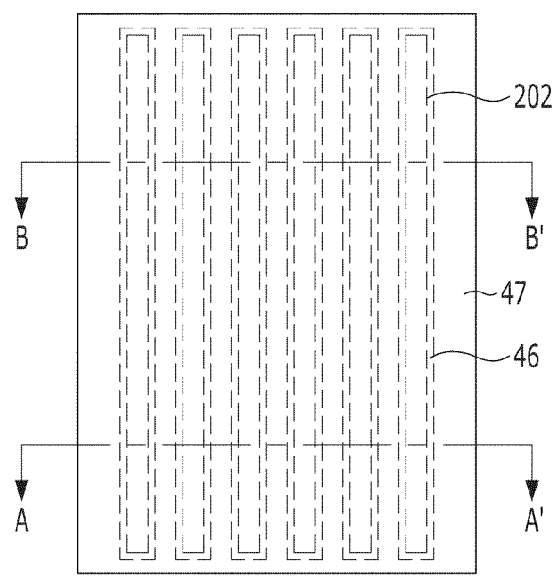
Figure 7B:
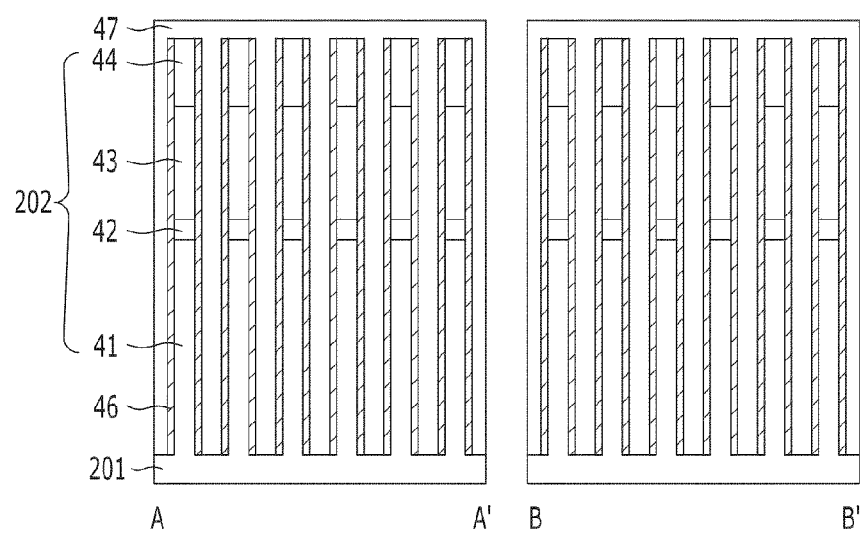

Referring to FIGS. 6B and 7B, the first photoresist pattern 45 is removed.

An insulation layer 47 is then formed on the entire surface of the resultant structure including the patterns 202. The insulation layer 47 is formed to gap fill the space between the patterns 202. The insulation layer 47 according to an example includes oxide. The insulation layer 47 may include any one selected from the group consisting of ULTO, HTO, LPTEOS, PETEOS, O$_3$-TEOS, and USG. Since the distance between the patterns 202 is small, the space between the patterns 202 may be completely gap-filled with the insulation layer 47, even though the insulation layer 47 may not be thick.

Figure 6C:
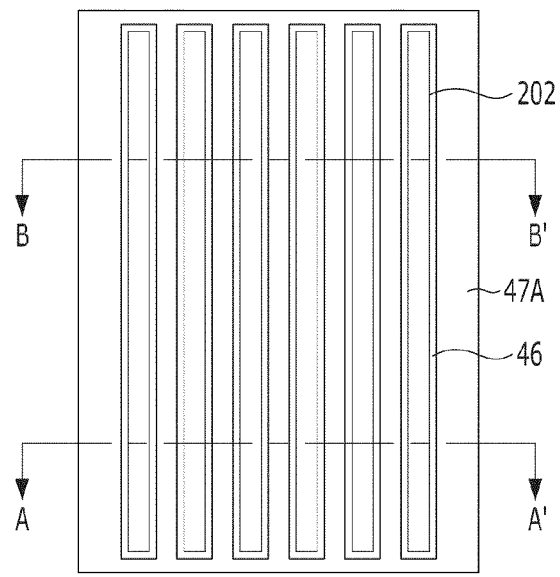
Figure 7C:
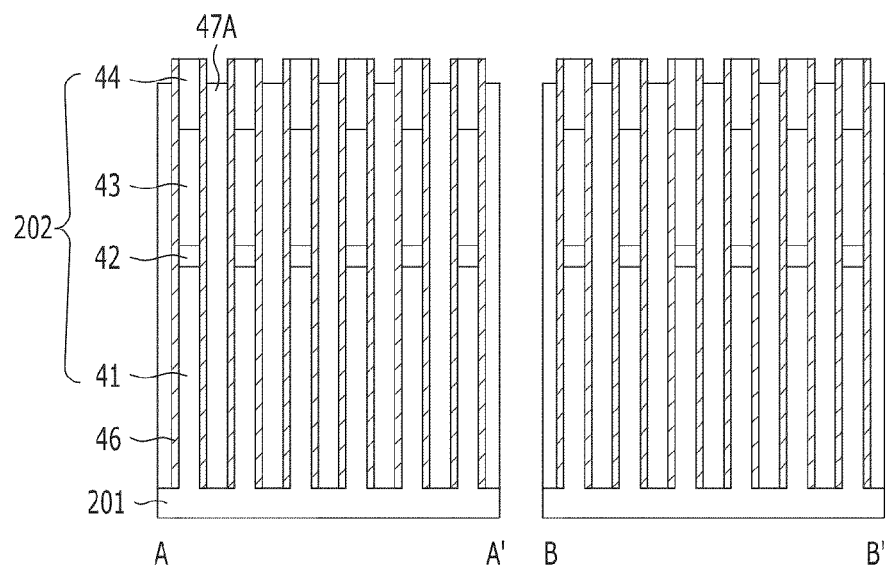

Referring to FIG. 6C and FIG. 7C, the first insulation layer 47 is partially removed. Accordingly, the first insulation layer 47A is recessed to expose the top surfaces of the patterns 202. When the hard mask layer 44 is formed by stacking a nitride layer and an oxide layer, the oxide layer of the hard mask layer 44 may be removed at the same time as the first insulation layer 47 is recessed. When the hard mask layer 44 is formed of only a nitride layer, the nitride layer is not removed during the recessing of the first insulation layer 47. The recess depth of the first insulation layer 47A may be controlled to reach about a middle of the hard mask layer 44 in height.

Figure 6D:
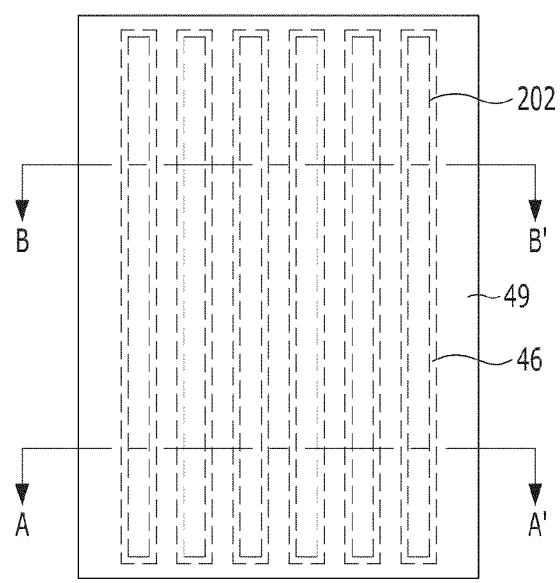
Figure 7D:
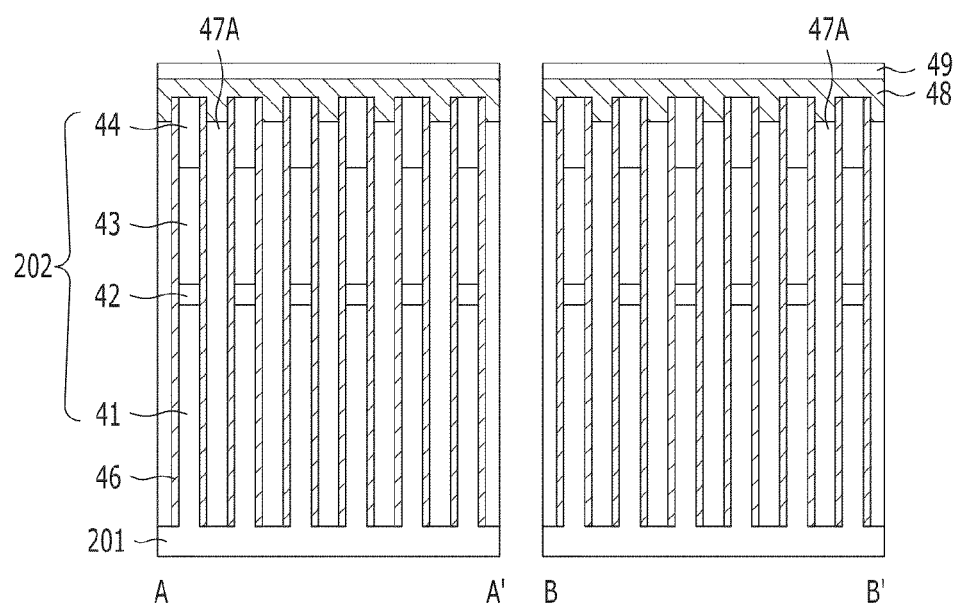

Referring to FIGS. 6D and 7D, a second insulation layer 48 and a third insulation layer 49 are stacked on the recessed first insulation layer 47A. According to an example, the second insulation layer 48 includes nitride such as silicon nitride, and the third insulation layer 49 include oxide. The third insulation layer 49 may include any one selected from the group consisting of ULTO, HTO, LPTEOS, PETEOS, O$_3$-TEOS, and USG.

Figure 6E:
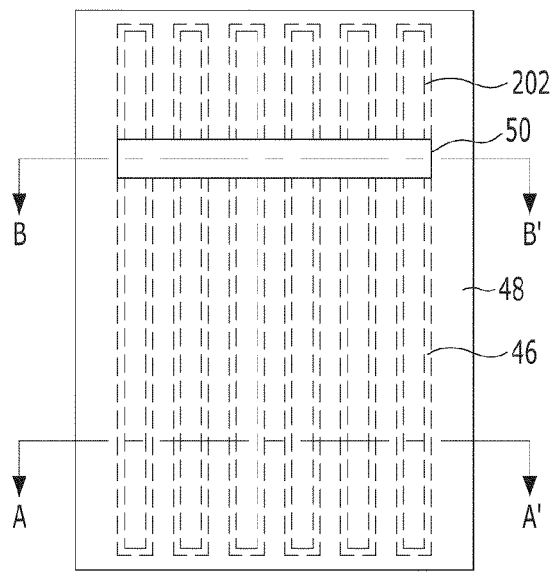
Figure 7E:
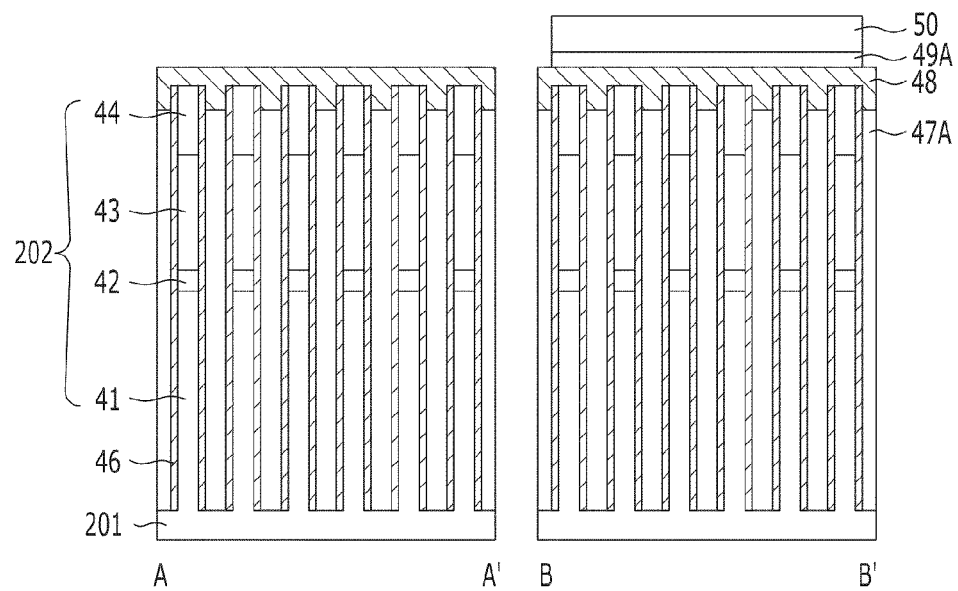

Referring to FIGS. 6E and 7E, a second photoresist pattern 50 is formed, and the third insulation layer 49 is etched by using the second photoresist pattern 50 as an etching barrier.

Figure 6F:
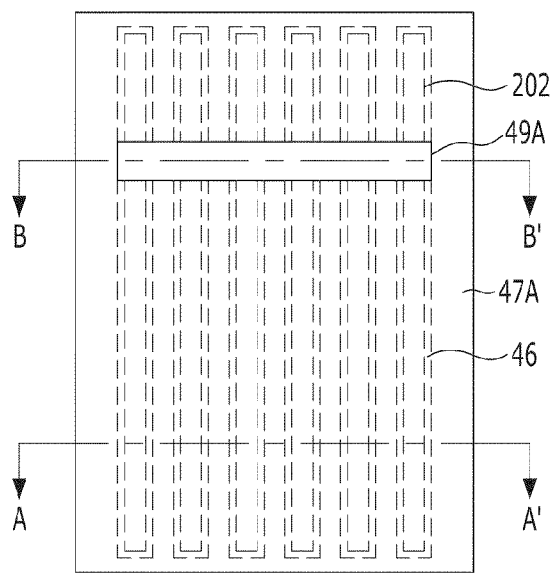
Figure 7F:
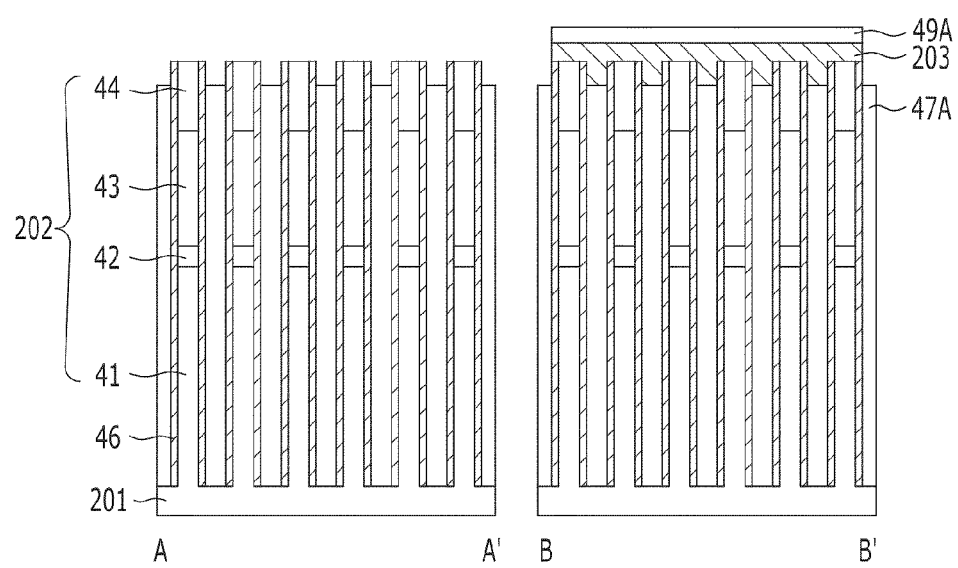

Referring to FIGS. 6F and 7F, the second insulation layer 48 is removed except the second insulation layer 48 lying under the third insulation layer 49. The remaining second insulation layer becomes the supporter 203. Under the supporter 203, the first insulation layer 47A still remains. Since the second insulation layer 48 includes nitride, the second insulation layer 48 may be partially removed by using a nitride strip process.

Figure 6G:
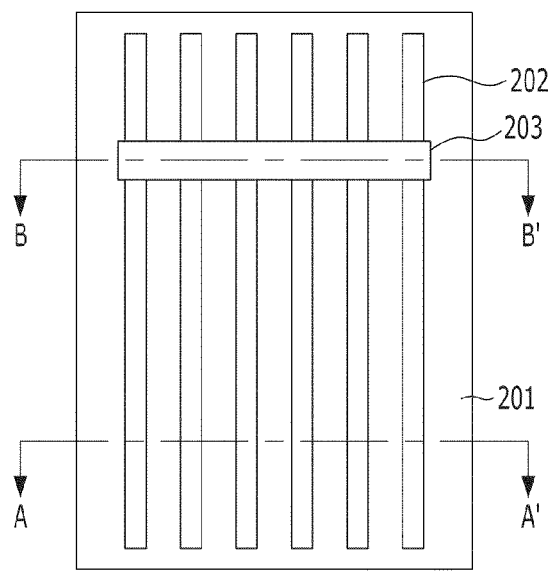
Figure 7G:
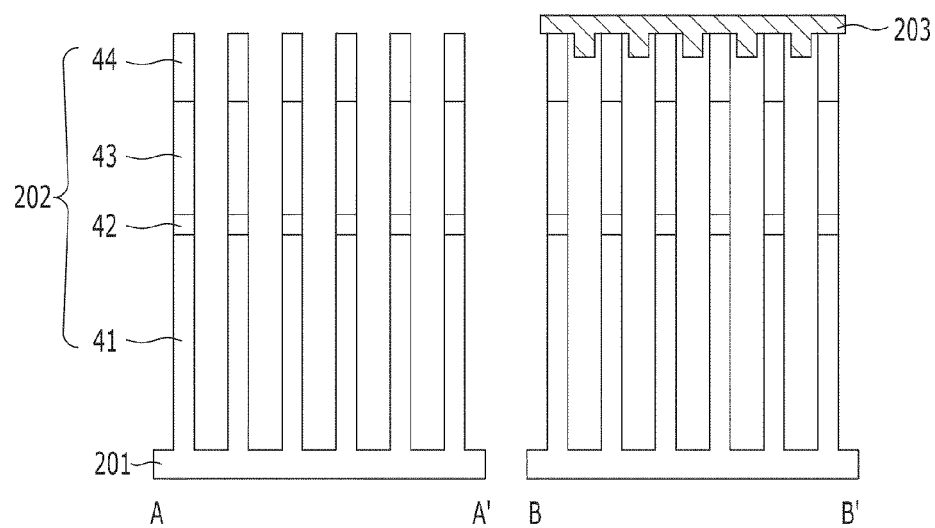

Referring to FIGS. 6G and 7G, the third insulation layer 49 and the second insulation layer 48 are all removed. Since the third insulation layer 49 and the first insulation layer 47A are oxide layers according to an example, an oxide etching process is applied. For example, wet etching is applied as the oxide etching process. Accordingly, the supporter 203 formed of nitride is not etched and remains.

The supporter 203 is formed in a floating type to simultaneously support the upper parts of the plurality of patterns 202. That is, the supporter 203 is formed only at the upper part of the hard mask layer 44 with the space underneath the supporter 203 being hollow. Accordingly, all etching residues 46 remaining on the sidewalls of the patterns 23 during the wet etching are substantially removed.

The supporter 203 may have a line shape, when seen from the plan view. The supporter 203 may extend in a direction perpendicular to the patterns 202. The supporter 203 is formed in a floating type to cover the top surfaces of the patterns 203, while crossing the patterns 202 at right angles. Since the second insulation layer is a nitride layer according to an example, the supporter 203 is a nitride supporter.

Since the supporter 203 reliably supports the patterns 202, pattern leaning is substantially prevented during the wet etching.

Figure 6H:
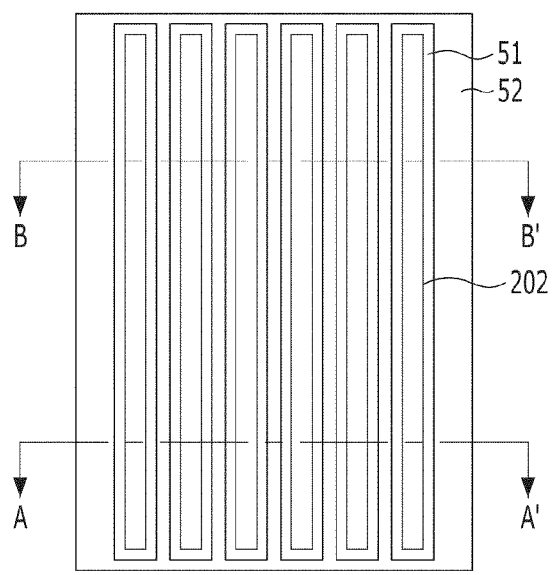
Figure 7H:
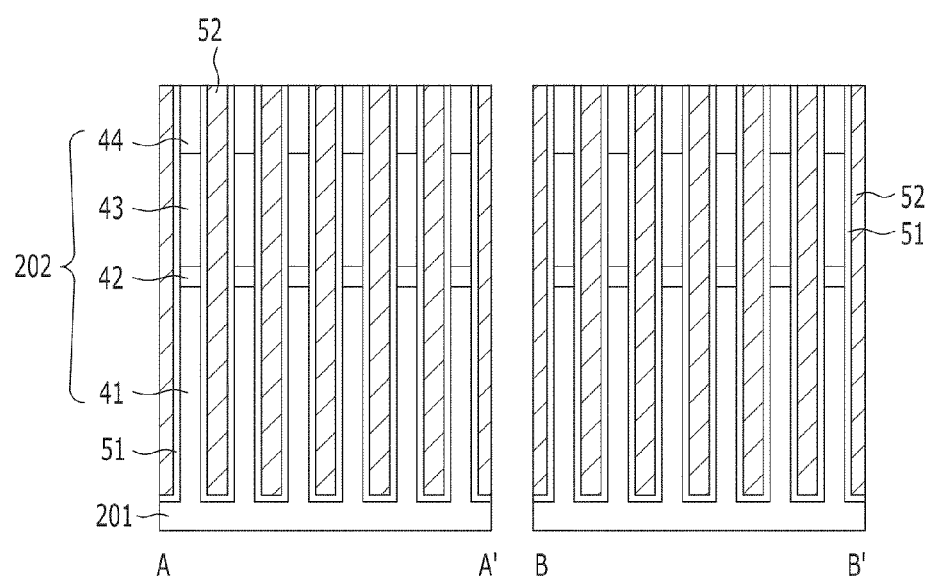

Referring to FIGS. 6H and 7H, an element isolation layer 52 is formed to gap fill the space between the respective patterns 202. The element isolation layer 52 according to an example includes oxide such as silicon oxide. The element isolation layer 52 may include a spin-on insulation layer based on polysilazane. When the element isolation layer 52 is formed, a planarization process using a CMP process is performed until the planarization process is stopped at the hard mask layer 44. At this time, the supporter 203 may be simultaneously planarized and removed. Since the supporter 202 in accordance with the second embodiment of the present invention is a nitride layer, the supporter 203 is removed, when the element isolation layer 52 is formed. Before the element isolation layer 52 is formed, a pre-cleaning process and a sidewall oxidation process may be performed.

In the first and second embodiments of the present invention, the SA-STI process in the method for fabricating a flash memory device has been described. However, the present invention may be applied to any reasonably suitable element isolation process including the SA-STI process. Furthermore, the present invention may be applied to a process for forming a high aspect ratio pattern in a method for fabricating a semiconductor memory device such as DRAM. Here, the high aspect ratio pattern includes an active region, a gate, a metal interconnection, a bit line, and a storage node.

In accordance with the embodiments of the present invention, the supporter is formed to obtain high aspect ratio patterns. Therefore, pattern leaning during the cleaning process for removing etching residues may be substantially prevented/reduced. Accordingly, the reliability of a semiconductor device coping with the design rule for high integration may be secured.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a multilayer over a substrate;
   forming a plurality of patterns by etching the multilayer and a portion of the substrate, wherein each of the plurality of patterns extends in a first direction;
   forming a supporter that is formed between the plurality of patterns and covers top surfaces of the plurality of patterns, wherein the supporter has a portion that spans across spaces between the plurality of patterns over the top surfaces of the plurality of patterns and wherein the supporter forms a line that divides each of the plurality of patterns into two portions divided by the line and that extends in a perpendicular direction to the first direction; and
   removing residues formed during the etching.

2. The method of claim 1, wherein the forming of the supporter comprises:
   forming an insulation layer to fill the spaces between the patterns and cover the top surfaces of the patterns;
   forming a photoresist pattern over the insulation layer, wherein the photoresist pattern crosses the patterns; and
   etching the insulation layer by using the photoresist pattern as an etching barrier.

3. The method of claim 2, wherein the insulation layer comprises oxide.

4. The method of claim 1, further comprising forming an isolation layer to fill the spaces between the patterns, after the removing of the residues.

5. The method of claim 1 wherein the multilayer is formed by stacking a tunnel insulation layer, a floating gate conductive layer, and a hard mask layer.

6. The method of claim 5, wherein the forming of the isolation layer is accompanied by a performance of a planarization process to partially remove the supporter and stop the planarization process upon reaching the hard mask layer.

7. The method of claim 1, wherein, in the forming of the supporter, the supporter is formed in a floating type to support upper parts of the patterns.

8. The method of claim 7, wherein the forming of the supporter comprises:
   forming a first insulation layer to fill the spaces between the respective patterns;
   recessing the first insulation layer to expose the top surfaces of the patterns;
   stacking a second insulation layer and a third insulation layer over the recessed first insulation layer;
   forming a photoresist pattern over the third insulation layer, wherein the photoresist pattern crosses the patterns;
   etching the third insulation layer by using the photoresist pattern as an etching barrier;
   removing the photoresist pattern; and
   forming the supporter by partially etching the second insulation using the third insulation layer as an etching barrier.

9. The method of claim 8, wherein the first and third insulation layers are formed of oxide, and the second insulation layer is formed of nitride.

10. The method of claim 9, further comprising removing the etching residues while removing the first and third insulation layers through wet etching, after the forming of the supporter.

11. The method of claim 10, further comprising forming an isolation layer to fill the spaces between the patterns, after the removing of the first and third insulation layers.

12. The method of claim 11, wherein the patterns are formed by stacking a tunnel insulation layer, a floating gate conductive layer, and a hard mask layer, and the forming of the isolation layer is accompanied by a planarization process by which the supporter is removed.

13. The method of claim 1, wherein at least one or more supporters are formed across the plurality of patterns.

14. A method for fabricating a semiconductor device, comprising:
   forming a plurality of patterns by etching a structure, wherein each of the plurality of patterns extends in a first direction;
   forming a supporter that is formed between the patterns and covers top surfaces of the patterns, wherein the supporter has a portion that spans across spaces between the patterns over the top surfaces of the patterns and wherein the supporter forms a line that divides each of the patterns into two portions divided by the line and that extends in a perpendicular direction to the first direction; and
   removing etching residues formed when the patterns are formed.

15. The method of claim 14, wherein the forming of the supporter comprises:
   forming an insulation layer to fill the spaces between the patterns and cover the top surfaces of the patterns; and
   etching the insulation layer, wherein the etched insulation layer supports the plurality of patterns.

16. The method of claim 15, wherein the forming of the supporter comprises etching the insulation layer by using a photoresist pattern crossing the plurality of patterns as an etching barrier.

17. The method of claim 14, wherein, in the forming of the supporter, the supporter is formed in a floating type to support upper parts of the patterns.

18. The method of claim 17, wherein the forming of the supporter comprises:
   forming a first insulation layer to fill the spaces between the respective patterns;
   recessing the first insulation layer to expose the top surfaces of the patterns;
   stacking a second insulation layer and a third insulation layer over the recessed first insulation layer;
   forming a photoresist pattern over the third insulation layer, wherein the photoresist pattern crosses the patterns;
   etching the third insulation layer by using the photoresist pattern as an etching barrier;
   removing the photoresist pattern; and
   forming the supporter by partially etching the second insulation using the third insulation layer as an etching barrier.

19. The method of claim 14, wherein the structure is formed as a multilayer comprising at least a conductive layer.

20. The method of claim 14, wherein the plurality of patterns comprise any one of an active region, a gate, a metal interconnection, and a storage node.

21. The method of claim 14, wherein the removing of the etching residues comprises a cleaning process.

22. The method of claim 14, wherein at least one or more supporters are formed across the plurality of patterns.

* * * * *